(12) United States Patent
Paladugu et al.

(10) Patent No.: US 12,476,532 B2
(45) Date of Patent: Nov. 18, 2025

(54) BIDIRECTIONAL POWER SWITCH CIRCUIT

(71) Applicant: NXP USA, Inc., Austin, TX (US)

(72) Inventors: Ranga Seshu Paladugu, Milpitas, CA (US); Soon G Lim, San Jose, CA (US); Ronak Prakashchandra Trivedi, Cupertino, CA (US); Carmelo Morello, San Jose, CA (US)

(73) Assignee: NXP USA, Inc., Austin, TX (US)

( * ) Notice: Subject to any disclaimer, the term of this patent is extended or adjusted under 35 U.S.C. 154(b) by 204 days.

(21) Appl. No.: 18/524,821

(22) Filed: Nov. 30, 2023

(65) Prior Publication Data

US 2024/0186882 A1    Jun. 6, 2024

(30) Foreign Application Priority Data

Dec. 1, 2022   (EP) .................................... 22210795

(51) Int. Cl.
*H02M 1/00* (2007.01)
*H02M 3/158* (2006.01)

(52) U.S. Cl.
CPC ......... *H02M 1/0054* (2021.05); *H02M 3/158* (2013.01)

(58) Field of Classification Search
CPC ............................ H02M 1/0054; H02M 3/158
See application file for complete search history.

(56) References Cited

U.S. PATENT DOCUMENTS

| 4,544,854 A | 10/1985 | Ulmer et al. | |
|---|---|---|---|
| 8,212,604 B2* | 7/2012 | Dianbo | H03K 17/063 327/434 |
| 8,368,453 B2* | 2/2013 | Company Bosch | H03K 17/063 327/437 |
| 8,896,363 B2* | 11/2014 | Chen | H03K 17/687 327/437 |

(Continued)

FOREIGN PATENT DOCUMENTS

| EP | 2226937 B1 | 2/2012 |
|---|---|---|
| JP | 2005137196 | 5/2005 |

OTHER PUBLICATIONS

A. Agarwal, S. Mukhopadhyay, A. Raychowdhury, K. Roy and C. H. Kim, "Leakage Power Analysis and Reduction for Nanoscale Circuits," in€IEEE Micro, vol. 26, No. 2, pp. 68-80, Mar.-Apr. 2006.

(Continued)

*Primary Examiner* — Rafael O De Leon Domenech (57) ABSTRACT

The disclosure relates to improvements in bidirectional power switch circuits. Example embodiments include a bidirectional power switch, BPS, circuit (200) comprising: first and second terminals (203, 204); first and second MOSFETs (201, 202, 501, 502) connected in series between the first and second terminals (203, 204) and comprising respective first and second source to body diodes (Dsb, Dsb1, Dsb2); first and second power supply rails (VDD, VEE); first, second, third, fourth and fifth switchable current sources (IDD1-3, SD1-3, IEE1-2, SE1-2); first and second resistors (Rbs, Rgs); and a BPS switching controller (206) configured to control operation of the BPS circuit (200) between a BPS ON state in which the first and second terminals (203, 204) are connected and a BPS OFF state in which the first and second terminals (203, 204) are disconnected.

20 Claims, 5 Drawing Sheets

(56) References Cited

U.S. PATENT DOCUMENTS

| | | |
|---|---|---|
| 9,118,322 B2 | 8/2015 | Husain et al. |
| 11,088,685 B2 | 8/2021 | Fujiwara et al. |
| 2007/0285149 A1* | 12/2007 | Nakatani ............ H03K 17/6871 |
| | | 327/427 |
| 2012/0299637 A1 | 11/2012 | Company Bosch et al. |

OTHER PUBLICATIONS

J. J. Su, K. S. Demirci and O. Brand, "A Low-Leakage Body-Guarded Analog Switch in 0.35 µm BiCMOS and Its Applications in Low-Speed Switched-Capacitor Circuits," in IEEE Transactions on Circuits and Systems II: Express Briefs, vol. 62, No. 10, pp. 947-951, Oct. 2015.

J. W. Tschanz€et al., "Adaptive body bias for reducing impacts of die-to-die and within-die parameter variations on microprocessor frequency and leakage," in€IE EE Journal of Solid-State Circuits, vol. 37, No. 11, pp. 1396-1402, Nov. 2002.

K. Ishida, K. Kanda, A. Tamtrakarn, H. Kawaguchi and T. Sakurai, "Managing subthreshold leakage in charge-based analog circuits with low-V/sub TH/ transistors by analog T-switch (AT-switch) and super cut-off CMOS (S C CMOS)," in€IEEE Journal of Solid-State Circuits, vol. 41, No. 4, pp. 859-867, Apr. 2006.

Rakesh Panguloori, "Achieve Bidirectional Control and Protection Through Back-to-Back Connected eFuse Devices", TI Application Report, SLVA948—Dec. 2017.

\* cited by examiner

BIDIRECTIONAL POWER SWITCH CIRCUIT

CROSS-REFERENCE TO RELATED APPLICATIONS

This application claims priority under 35 U.S.C. § 119 to European patent application no. 22210795.5, filed Dec. 1, 2022, the contents of which are incorporated by reference herein.

FIELD

The disclosure relates to improvements in bidirectional power switch circuits.

BACKGROUND

A bidirectional power switch (BPS) is an active switch that supports bidirectional current flow when in the ON condition and bidirectional voltage blocking when in the OFF condition. BPS circuits may be realised using P-channel or N-channel MOSFETs, commonly using either a single MOSFET with a body bias or a back-to-back arrangement of a pair of MOSFETs in either a common source or common drain configuration.

In BPS circuits, a low ON resistance of the switches is required for lower power dissipation and lower voltage drops. In high precision applications, a low OFF state leakage current is required at the input/output terminals of these switches. A high W/L aspect ratio may be used to lower the ON resistance and provide a higher current capability for a MOSFET, but this results in an increased size as well as a higher OFF leakage current and slower switching speeds.

Figure 1:
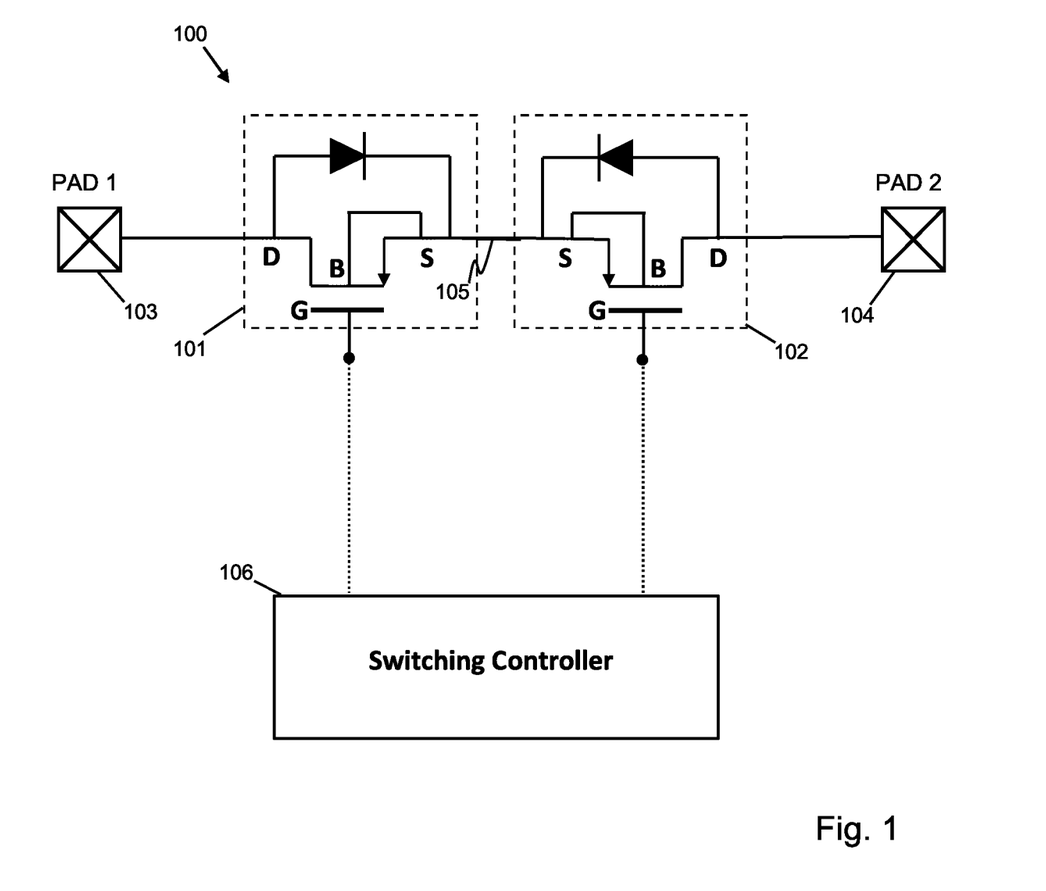
FIG. 1 is a schematic circuit diagram of a conventional bidirectional MOSFET power switch circuit having a pair of back-to-back connected PMOS devices in a common source configuration.

A conventional BPS circuit 100 is shown in FIG. 1. The circuit 100 comprises a pair of MOSFETs 101, 102, which in this example are PMOS transistors. The MOSFETs 101, 102 are connected in series between first and second terminals 103, 104. Each MOSFET 101, 102 has a source S, gate G, drain D and body terminal B. The body terminal B of each MOSFET 101, 102 is connected to a common source node 105. The drain D of each MOSFET 101, 102 is connected to a respective one of the first and second terminals 103, 104. The gate G of each MOSFET 101, 102 is connected to a BPS switching controller (or Control Block) 106, which controls the switching operation of the BPS circuit 100. This topology is commonly used to support BPS functionalities like bidirectional current flow in the ON state and bidirectional voltage blocking in the OFF state.

For high voltage (HV) applications (for example at supply voltage levels of around +/−24V), in which higher area HV device switches may need to be used, the layout area penalty from high W/L aspect ratio sized MOSFETs becomes more severe, making it more difficult to integrate such devices on chip. Higher area devices have higher gate capacitances, which results in an increase in switch turn ON/OFF times, lowering their switching speed. Also, when the aspect ratio of the MOSFETs is high, this increases the OFF state subthreshold leakage current flowing in or out of the terminals 103, 104. In high precision applications a low OFF state leakage current is required at the terminals.

SUMMARY

To overcome the above problems, circuit techniques to reduce the ON resistance and reduce the OFF state subthreshold leakage currents in bidirectional switches with a conventional BPS topology having a pair of back-to-back connected devices in a common source configuration are proposed. The circuit implementation described herein involves configuring and using sourcing and sinking switchable current sources at Gate, Body and Source Terminals of the BPS device switch along with added resistors to generate the necessary voltage drops to realize the techniques. This circuit implementation has lower area, power, etc and is more easily implementable in the high voltage domain.

According to a first aspect there is provided a bidirectional power switch, BPS, circuit comprising:
first and second terminals;
first and second MOSFETs connected in series between the first and second terminals and comprising respective first and second source to body diodes;
first and second power supply rails;
a first switchable current source connected between the first power supply rail and a body terminal of the first MOSFET;
a second switchable current source connected between the first power supply rail and a common node connected to a source terminal of each of the first and second MOSFETs;
a third switchable current source connected between one of the first and second power supply rails and a gate terminal of the first MOSFET;
a fourth switchable current source connected between the second power supply rail and the body terminal of the first MOSFET;
a fifth switchable current source connected between the second power supply rail and the common node;
a first resistor connected between the body terminal of the first MOSFET and the common node;
a second resistor connected between the gate terminal of the first MOSFET and the common node; and
a BPS switching controller configured to control operation of the BPS circuit between a BPS ON state in which the first and second terminals are connected through the first and second MOSFETs and a BPS OFF state in which the first and second terminals are disconnected.

The BPS circuit may further comprise:
a sixth switchable current source connected between the first power supply rail and a body terminal of the second MOSFET;
a seventh switchable current source connected between the second power supply rail and the body terminal of the second MOSFET; and
a third resistor connected between the body terminal of the second MOSFET and the common node,
wherein the gate terminals of the first and second MOSFETs are connected to each other.

The first and second MOSFETs may be P-channel MOSFETs and an anode of each of the first and second source to body diodes connected to the common node.

The third switchable current source may be connected between the first power supply rail and the gate terminals of the first and second MOSFETs.

The BPS circuit may comprise a current switching controller configured to operate the switchable current sources.

The current switching controller may be configured, in the BPS OFF state, to switch on the first, fifth and seventh switchable current sources to apply a reverse bias voltage across the first and second source to body diodes.

The current switching controller may be configured, in the BPS OFF state, to switch on the third and fifth switchable current sources to apply a positive gate to source voltage across the first and second MOSFETs.

The current switching controller may be configured, in the BPS ON state, to switch on the second, fourth and seventh switchable current sources to apply a forward bias voltage across the first and second source to body diodes.

The first and second MOSFETs may be N-channel MOSFETs and a cathode of each of the first and second body diodes connected to the common node.

The third switchable current source may be connected between the second power supply rail and the gate terminals of each of the first and second MOSFETS.

The BPS circuit may comprise a current switching controller configured, in the BPS OFF state, to switch on the second, fourth and seventh switchable current sources to apply a reverse bias voltage across the first and second source to body diodes.

The current switching controller may be configured, in the BPS OFF state, to switch on the second and third switchable current sources to apply a positive source to gate voltage across the first and second MOSFETs.

The current switching controller may be configured, in the BPS ON state, to switch on the first, fifth and sixth switchable current sources to apply a forward bias voltage across the first and second source to body diodes.

According to a second aspect there is provided a method of operating a bidirectional power switch, BPS, circuit according to the first aspect, the method comprising:
  in a BPS ON state, operating the switchable current sources to apply a forward bias voltage across the first and second source to body diodes; and
  in a BPS OFF state, operating the switchable current sources to apply a reverse bias voltage across the first and second source to body diodes.

The first and second MOSFETs may be P-channel MOSFETs and, in the BPS OFF state, the switchable current sources operated to apply a positive gate to source voltage across the first and second MOSFETs. Alternatively, the first and second MOSFETs may be N-channel MOSFETs and, in the BPS OFF state, the switchable current sources operated to apply a positive source to gate voltage across the first and second MOSFETs.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Figure 2:
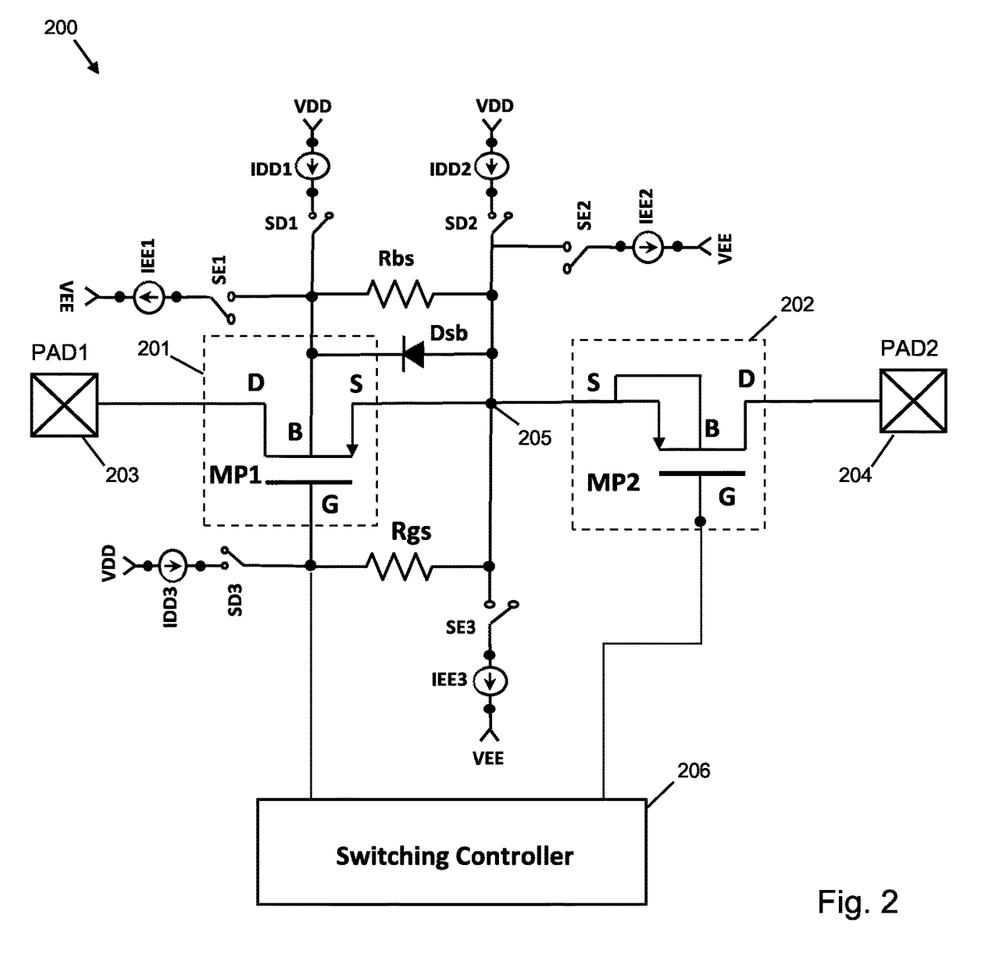
FIG. 2 is a schematic circuit diagram of an example bidirectional MOSFET power switch circuit.

FIG. 2 illustrates an example BPS circuit 200 comprising a pair of series (or back-to-back) connected P-channel MOSFETs 201, 202 in a common source configuration, which are arranged to operate as switches for connecting and disconnecting first and second terminals 203, 204. A similar arrangement may be made for N-channel MOSFET switches, an example of which is described in more detail below. In this example, the source terminals S of the MOSFETs 201, 202 are connected to a common node 205.

Various circuit techniques are applied in the BPS circuit 200 to reduce the ON resistance and to reduce the OFF state subthreshold leakage current of the switches 201, 202. For clarity, only the implementation of these techniques as applied to the first switch 201 are shown in FIG. 2.

A first switchable current source, represented in FIG. 2 by a first current source IDD1 in series with a first switch SD1, is connected between a first power supply rail providing a first voltage supply VDD and the body terminal B of the first MOSFET 201. A second switchable current source, represented by a second current source IDD2 in series with a second switch SD2, is connected between the first power supply rail VDD and the common node 205. A third switchable current source, represented by a third current source IDD3 in series with a third switch SD3, is connected between the first power supply rail VDD and the gate terminal G of the first MOSFET 201. The first, second and third current sources IDD1, IDD2, IDD3 may be considered sourcing current sources, i.e. are each configured to provide a current flow from the first power supply rail VDD when the respective switch SD1, SD2, SD3 is closed.

A fourth switchable current source, represented by fourth current source IEE1 in series with a fourth switch SE1, is connected between the second power supply rail providing a second voltage supply VEE and the body terminal B of the first MOSFET 201. A fifth switchable current source, represented by fifth current source IEE2 in series with a fifth switch SE2, is connected in series between the second power supply rail VEE and the common node 205. A sixth switchable current source, represented by a sixth current source IEE3 and a sixth switch SE3, is connected between the second power supply rail VEE and the common node 205. The fourth, fifth and sixth current sources IEE1, IEE2, IEE3 may be considered sinking current sources, i.e. are each configured to provide a current flow to the second power supply rail VEE when the respective switch SE1, SE2, SE3 is closed.

The first voltage supply VDD may be a positive supply voltage and the second voltage supply VEE may be ground or a negative supply voltage.

A first resistor Rbs is connected between the body terminal B of the first MOSFET 201 and the common node 205. A second resistor Rgs is connected between the gate terminal G of the first MOSFET 201 and the common node 205. A Source to Body junction diode Dsb of the first MOSFET 201 is intrinsically present between the body terminal B of the first MOSFET 201 and the common node 205, the anode of the diode Dsb being connected to the common node 205.

In the ON state of the BPS circuit 200, by configuring the switchable current sources and resistors a forward bias voltage is created across the diode Dsb to lower the threshold voltage Vth of the first MOSFET 201, thus lowering its ON resistance.

In the OFF state of the BPS circuit 200, by configuring the switchable current sources and resistors a reverse bias voltage is created across the diode Dsb to increase the threshold voltage Vth of the first MOSFET 201, thus lowering its OFF state subthreshold leakage current.

Also in the OFF state of the BPS circuit 200, by configuring the switchable current sources and resistors a positive Gate to Source voltage Vgs is created, moving the first MOSFET 201 into the accumulation region or mode of operation, thus lowering its OFF state subthreshold leakage current.

As shown in FIG. 2, a first resistor Rbs is connected between the Body terminal B and Source terminal S of the first MOSFET 201. The sourcing first current source IDD1 and sinking fourth current source IEE1 are connected to the Body terminal B through first and fourth switches SD1, SE1 respectively. Similarly, a sourcing second current source IDD2 and sinking fifth current source IEE2 are connected to the Source terminal S through second and fifth switches SD2, SE2 respectively. As in a conventional BPS topology, a gate biasing second resistor Rgs is connected between the Gate terminal G and Source terminal S of the first MOSFET 201. The gate biasing resistor Rgs is typically used to turn ON or OFF the first MOSFET 201 using the BPS switching controller 206.

Sinking fifth and sixth current sources IEE2 and IEE3 are connected to the common node 205, which in this example is connected to the source terminal S of each MOSFET 201, 202. To reduce the overall area, these switchable current sources may be combined into a single switchable current source with the appropriate current magnitude and proper new switch timing (combining for the timing of fifth and sixth switches SE2, SE3). Although not shown in FIG. 2, similar circuit components can be added to the second MOSFET 202 to obtain similar performance improvements, as described below in relation to FIG. 4.

During the BPS ON state, second and fourth switches SD2, SE1 are turned ON. The current from second current source IDD2 then flows through the first resistor Rbs from the Source terminal S to the Body terminal B of the first MOSFET 201 into the fourth current source IEE1. This creates a positive voltage drop across the Source terminal S to the Body terminal B of the first MOSFET 201. This implies that a forward bias voltage across the Source to Body junction diode Dsb is generated. As shown in Equation 1 below regarding the NMOS device body effect, the threshold voltage Vth of an N-channel MOSFET device decreases with increasing forward bias voltage Vbs across the Body to Source diode due to the body effect.

$$V_{th} = V_{t0} + \gamma(\sqrt{\phi_s + V_{bs}} - \sqrt{\phi_s})$$ (equation 1)

As shown in Equation 2 below regarding the NMOS ON resistance, a reduced threshold voltage also decreases the ON channel resistance $R_{ds}$ for a given Gate to Source voltage Vgs.

$$R_{ds} \approx 1/[k_n'W/L(V_{gs}-V_{th})]$$ (equation 2)

Hence, the ON resistance $R_{on}$ of the first P-channel MOSFET 201 is reduced by generating a positive forward bias voltage across the Source to Body junction diode Dsb. The magnitude of this forward bias voltage can be controlled by the magnitudes of current values through current sources IDD2, IEE1 and the magnitude of resistor Rbs. With this reduction in ON resistance, the size of the first MOSFET 201 can be reduced to meet a given specified ON resistance requirement. This helps in reducing the overall switch size, as well as reducing the switching ON/OFF times and the OFF state leakage currents. Any residual current generated from a mismatch in the IDD2 and IEE1 currents flows in or out of the turned ON MOSFETs 201, 202, which have low impedance paths to the first and second terminals 203, 204.

In the BPS OFF state, both the first and second MOSFETs 201, 202 are OFF. The outputs of the BPS switching controller 206 controlling the MOSFETs Gate terminals are in a high impedance state. The Gate terminal G of the first MOSFET 201 is at the same potential as the Source terminal S (and common node 205) through Rgs, with Vgs=0V as expected in the OFF device. The Gate terminal of the second MOSFET 202 is also in a similar condition. In this OFF state, the leakage currents flowing through the first and second terminals 203, 204 should be very low in high precision applications. For short length devices, the OFF state leakage currents are dominated by subthreshold leakage currents. The BPS switch subthreshold leakage current can be reduced through two techniques, either or both of which can be used to reduce the subthreshold leakage current.

According to the first technique, during the BPS OFF state the first and fifth switches SD1, SE2 are turned ON. The magnitude of current provided by the first current source IDD1 is designed to be greater than the magnitude of current provided by the fifth current source IEE2 (IDD1>IEE2). In this condition, the Body terminal B of the first MOSFET 201 is pulled up high, close to the supply voltage VDD potential, until the Drain to Source voltage Vds of the MOSFET device of the current source IDD1 gets below its Overdrive voltage (Vov) or Vdsat. This results in the MOSFET device of the IDD1 current source transitioning from saturation region into its triode/linear region of operation and its current magnitude drops until it reaches the magnitude value of IEE2. In this state, the IEE2 magnitude current flows through the resistor Rbs from the Body to Source terminal. This creates a negative voltage across Source to Body terminal or a reverse bias voltage across the Source to Body junction diode Dsb of BPS switch MP1. As shown in Equation 1 above, due to the body effect a reverse bias voltage across the body diode increases the threshold voltage Vth of the device. An increased threshold voltage reduces the OFF state subthreshold leakage current, as shown in Equation 3 below regarding the NMOS device subthreshold current $I_{sub}$.

$$I_{sub} \approx K * Io * \exp\left\{\frac{Vgs - Vth}{nV}\right\}$$ (equation 3)

Hence, the OFF leakage current of the first P-channel MOSFET 201 can be reduced by generating a reverse bias voltage across the Source to Body junction diode Dsb. The magnitude of the reverse bias voltage can be controlled by the magnitudes of current flowing through the current sources IDD1, IEE2 or the magnitude of resistor Rbs.

According to the second technique, during the BPS OFF state the third and sixth switches SD3, SE3 are turned ON or, if the fifth and sixth switches SE2, SE3 are combined, the third and fifth switches SD3, SE2 are turned ON. The magnitude of current through the third current source IDD3 is designed to be greater than the magnitude of current through the sixth current source IEE3 (IDD3>IEE3) (or the fifth current source IEE2). In this condition, the Gate terminal G of the first MOSFET 201 is pulled up high close to the supply voltage line VDD potential until the IDD3 current source PMOS device MPD3 Drain to Source voltage Vds gets below its Overdrive voltage (Vov) or Vdsat. This results in the IDD3 current source PMOS device transition from saturation region into triode/linear region of operation and its current magnitude drops until it reaches the magnitude value of IEE3. In this state, the magnitude of current through IEE3 flows through the resistor Rgs from the Gate terminal G to the Source terminal S of the first MOSFET 201. This creates a positive Vgs voltage across the Gate to Source terminals, which pushes the first MOSFET 201 into the accumulation region or mode of operation. As shown in Equation 3 above for an NMOS device, a positive Gate to Source voltage for a PMOS device decreases the OFF subthreshold leakage current. Hence, the subthreshold leakage current can be reduced by generating a positive Gate to Source voltage across the resistor Rgs. The magnitude of this voltage can be controlled by the magnitudes of current through current sources IDD3, IEE3 or the magnitude of resistor Rgs.

Hence, as mentioned above, through the use of sourcing and sinking current sources, switches and resistors, the Body, Source and Gate terminals of the first MOSFET 201 can be controlled dynamically depending on the ON or OFF state.

In one implementation, each of the current source switches SD1-3,SE1-3 need not be separately added in series, but may be part of switchable current sources (IDD1-3, IEE1-3). When a current source does not source or sink any current, the path is in a high impedance condition and is considered OFF. Hence, the current in current sources can be modulated (e.g. between a desired current and no current) to emulate switching functionality.

In the high voltage (HV) domain applications (for example at supply voltages=+/−24V), the first and second MOSFET BPS switches 201, 202 are high voltage devices such as LDMOS or DEMOS FETs. For example, in LDMOS FETs, even though the Drain to Source terminals potential difference can have high breakdown voltages (e.g. 50V), other terminals potential differences such as the Gate to Source, Body to Source or Gate to Body terminals may have breakdown voltages only up to 5V. Hence, in the high voltage domain we cannot tie the device's Body or Gate terminals to a fixed Highest or Lowest potentials in ON/OFF states independent of Drain/Source terminals, as doing so can exceed the breakdown voltages and results in device breakdowns across different conditions. For example, if we tie the Body or Gate terminal to the positive supply voltage +24V while the Source terminal is at 0V, it results in Gate to Source or Body to Source breakdown. All the terminal voltages (G, B, D, S) in the BPS switch device are not fixed but are dynamically varying around Drain/Source terminal voltages depending on the magnitude and polarity of the input current or input voltage applied. The present circuit implementation (shown in FIG. 2) biases the Gate, Body terminals with reference to the Source voltage (for example Gate and Body are biased within Vsource +/−4V) keeping the HV device switch in safe operating area (SOA) without exceeding any breakdown voltages. In this HV domain application, the current sources IDD1-3, IEE1-3 use HV devices, but the circuits that generate reference currents for these current sources and the switching logic of these currents can be implemented in the low voltage domain.

This circuit implementation in the HV domain has numerous advantages compared to previous implementations. Previous implementations may be designed to operate in the low voltage domain (for example 0V to 5V), and may not be operable in higher voltage domains (say +/−24V). In some prior implementations, the Gate or Body terminals are biased or driven close to the supply rail voltages independent of Drain/Source terminal voltages, which would result in device breakdown in the HV domain. This is solved in the present disclosure by biasing the Body and Gate terminals closely around the Source terminal, thereby keeping the HV device in a safe operating area without any device breakdown issues. A further advantage is that this can be achieved without many HV level shifters or other additional circuit blocks such as a charge pump or amplifier, which would consume more layout area and more power compared to the present disclosure involving current sources and switching logic operating in the low voltage domain.

Figure 3A:
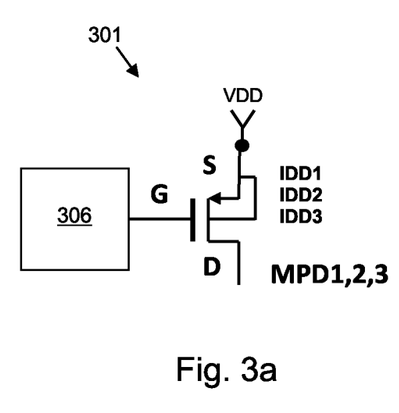
FIG. 3a is a schematic circuit diagram of an example P-channel MOSFET for implementing the first, second and third switchable current sources in the circuit of FIG. 2.
Figure 3B:
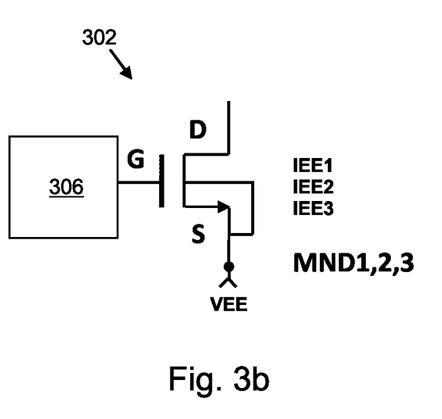
FIG. 3b is a schematic circuit diagram of an example N-channel MOSFET for implementing the fourth, fifth and sixth switchable current sources in the circuit of FIG. 2.

FIGS. 3a and 3b illustrate example circuits based on P-channel and N-channel MOSFETs for implementing the switchable current sources in the example shown in FIG. 2. The first, second and third switchable current sources IDD1, IDD2, IDD3 with associated switches SD1, SD2, SD3 may each be independently implemented by a P-channel MOSFET 301 with its gate controlled by a current switching controller 306 as shown in FIG. 3a, while the fourth and fifth (and, if necessary, sixth) current sources IEE1, IEE2, IEE3 may each be independently implemented by the N-channel MOSFET 302 with its gate controlled by the current switching controller 306 as shown in FIG. 3b. Various other implementations of the switchable current sources may be envisaged. Also, in some implementations sourcing current sources IDD1, IDD3 may be so large that they can be replaced with an appropriate resistor.

The current switching controller 306 for controlling operation of the switchable current sources may be a separate controller to the BPS switching controller 206 for controlling the switching operation of the MOSFETs 201, 202 or may be integrated into a common switching controller for controlling switching of the MOSFETs 201, 202 and each of the switchable current sources.

Figure 4:
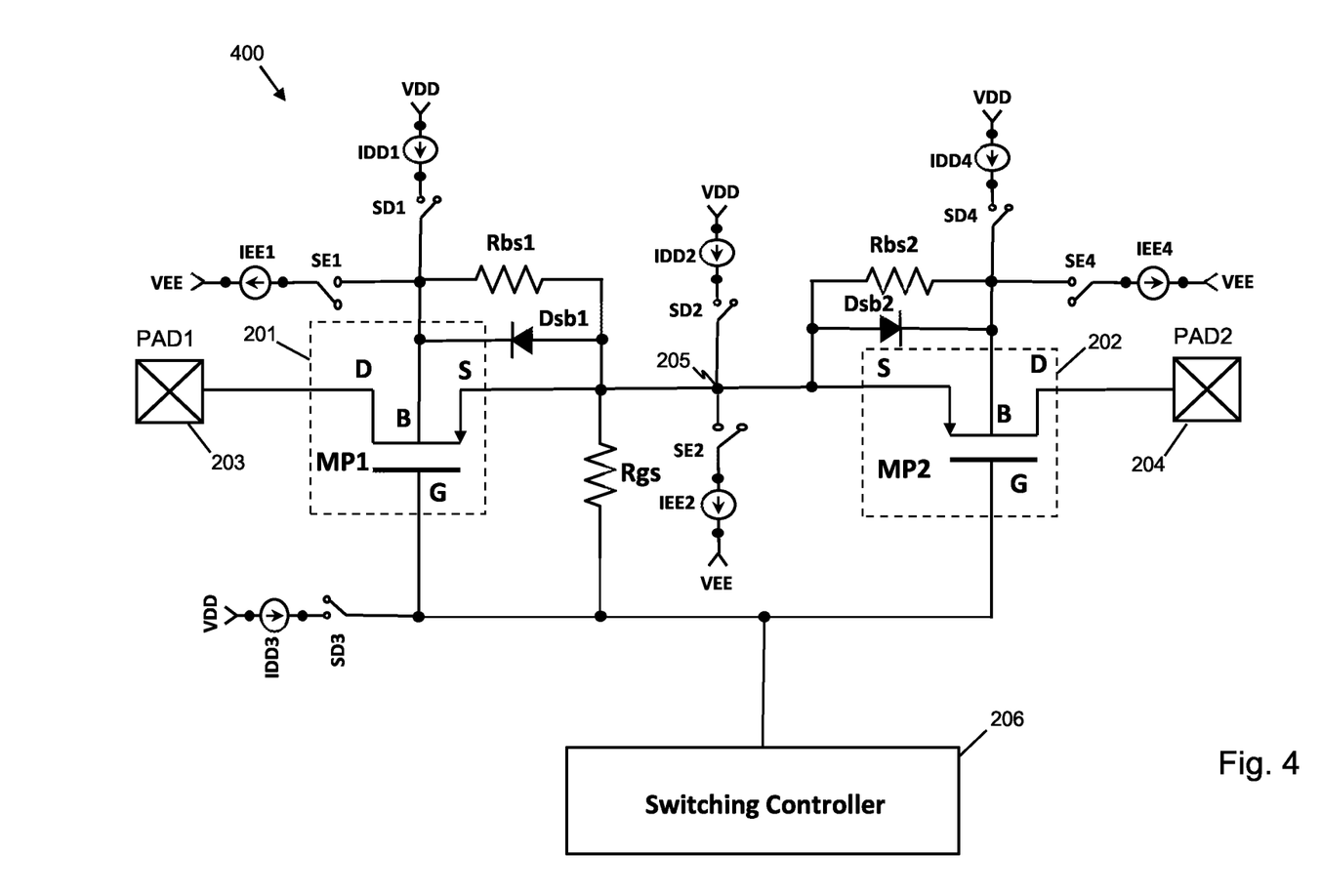
FIG. 4 is a schematic diagram of a further example bidirectional MOSFET power switch circuit.

FIG. 4 illustrates an example BPS circuit 400, in which additional current sources are included for controlling the ON resistance and OFF subthreshold leakage current of the second MOSFET 202 and in which certain components are combined, including the gate to source resistor Rgs, which is common to both the first and second MOSFETs 201, 202. The first to fifth switchable current sources described above in relation to FIG. 2 are also present in FIG. 4. A sixth switchable current source, shown as current source IDD4 and switch SD4, is connected between the first power supply rail VDD and a body terminal B of the second MOSFET 202. A seventh switchable current source, shown as current source IEE4 and switch SE4, is connected between the second power supply rail VEE and the body terminal B of the second MOSFET 202. A third resistor Rbs2 is connected between the body terminal B of the second MOSFET 202 and the common node 205. A second diode Dsb2 is intrinsically present or formed between the body terminal B of the second MOSFET 202 and the common node 205. As with the first diode Dsb1, the anode of the second diode Dsb2 is connected to the common node 205. The gate terminals G of the first and second MOSFETs 201, 202 are connected to each other, enabling a common gate to source resistor Rgs to be connected between the common node 205 and each of the gates G. Two switchable current sources for implementing above mentioned different techniques are combined to form a common current source IDD2 and switch SD2. Similarly, three switchable current sources for implementing different techniques are combined to form a common current source IEE2 and switch SE2. The magnitudes of currents in the combined common current sources like IDD2 and IEE2 are increased accordingly for proper functionality. The timing of switches SD2, SE2 are also adjusted accordingly.

In the BPS OFF state, the BPS switching controller 206 output driving the gate terminals is in a high impedance state. The Gate terminals G of the first and second MOSFETs 201, 202 are at the same potential as the Source terminal (and common node 205) through Rgs, with Vgs=0V as expected in the OFF device. To reduce the OFF state subthreshold leakage current of MOSFETS 201, 202, for the first technique, the first, fifth and seventh switchable current sources IDD1, SD1, IDD4, SD4, IEE2, SE2 are switched ON to apply a reverse bias voltage across the first and second diodes Dsb1, Dsb2.

In the BPS OFF state, for the second technique, the third and fifth switchable current sources IDD3, SD3, IEE2, SE2 are turned ON to generate a positive gate to source voltage across the first and second MOSFETs 201, 202.

In the BPS ON state, to reduce the ON resistance of MOSFETs 201, 202 the second, fourth and seventh switchable current sources IDD2, SD2, IEE1, SE1, IEE4, SE4 are turned ON to apply a forward bias voltage across the first and second diodes Dsb1, Dsb2.

Table 1 below indicates the state of each of the switches SD1-SD5 and SE1-SE5 for the BPS circuit 400 of FIG. 4 for the BPS ON state and the BPS OFF state.

TABLE 1

State table for switches SD1-SD4 and SE1-SE4

| Switch | BPS ON State | BPS OFF State |
|---|---|---|
| SD1 | OFF | ON - body diode reverse biased |
| SD2 | ON - body diode forward biased | OFF |
| SD3 | OFF | ON - (reverse) positive gate-source voltage |
| SD4 | OFF | ON - body diode reverse biased |
| SE1 | ON - body diode forward biased | OFF |
| SE2 | OFF | ON - body diode reverse biased And/Or (reverse) positive gate-source voltage |
| SE4 | ON - body diode forward biased | OFF |

Figure 5:
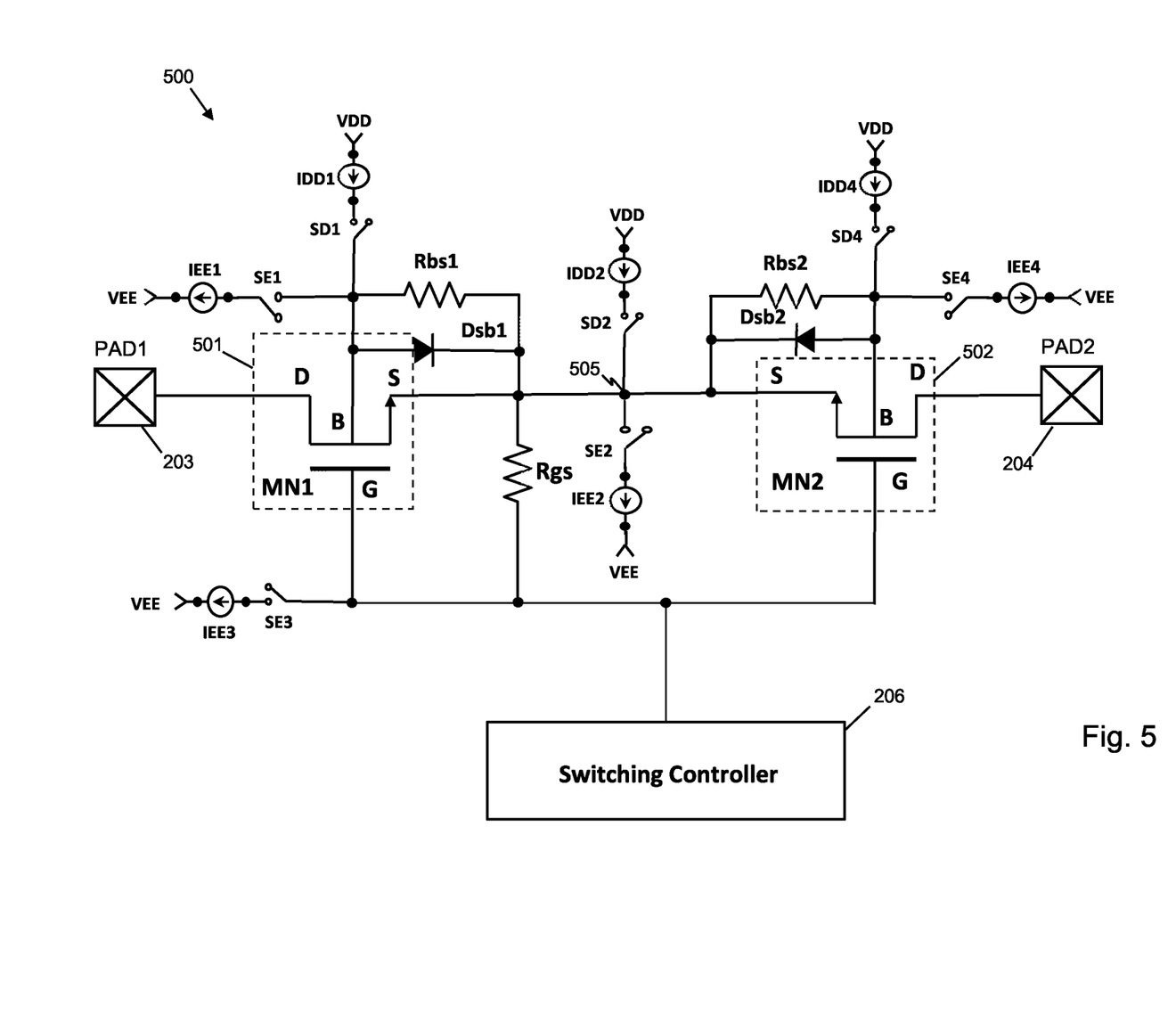
FIG. 5 is a schematic diagram of a further example bidirectional MOSFET power switch circuit.

FIG. 5 illustrates an alternative example BPS circuit 500 in which the P-channel MOSFETs 201, 202 of FIGS. 2 and 4 are replaced with N-channel MOSFETs 501, 502. Many of the current sources are similar to those of the above mentioned circuits 200, 400 but with some differences including a cathode of each of the first and second diodes Dsb1, Dsb2 being connected to the common node 505 and the third switchable current source, represented by current source IEE3 and switch SE3, being connected between the second power supply rail VEE and the gate terminals G of each of the first and second MOSFETs 501, 502. Three switchable current sources for implementing the above mentioned different techniques are combined to form a common current source IDD2 and switch SD2. Similarly, two switchable current sources for implementing different techniques are combined to form a common current source IEE2 and switch SE2. The magnitudes of currents in the combined common current sources like IDD2 and IEE2 are increased accordingly for proper functionality. The timing of switches SD2, SE2 are also adjusted accordingly.

In the BPS circuit 500 of FIG. 5, in the BPS OFF state the second, fourth and seventh switchable current sources IDD2, SD2, IEE1, SE1, IEE4, SE4 are switched ON to apply a reverse bias voltage across the first and second diodes Dsb1, Dsb2.

In the BPS OFF state, the second and third switchable current sources IDD2, SD2, IEE3, SE3 are switched ON to generate a positive source to gate voltage (or negative gate to source voltage) across the first and second MOSFETs 501, 502.

In the BPS ON state, the first, fifth and sixth switchable current sources IDD1, SD1, IEE2, SE2, IDD4, SD4 are switched ON to apply a forward bias voltage across the first and second diodes Dsb1, Dsb2.

From reading the present disclosure, other variations and modifications will be apparent to the skilled person. Such variations and modifications may involve equivalent and other features which are already known in the art of bidirectional power switches, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A bidirectional power switch (BPS) circuit comprising:
   first and second terminals;
   first and second MOSFETs connected in series between the first and second terminals and comprising respective first and second source to body diodes;
   first and second power supply rails;
   a first switchable current source connected between the first power supply rail and a body terminal of the first MOSFET;
   a second switchable current source connected between the first power supply rail and a common node connected to a source terminal of each of the first and second MOSFETs;
   a third switchable current source connected between one of the first and second power supply rails and a gate terminal of the first MOSFET;

a fourth switchable current source connected between the second power supply rail and the body terminal of the first MOSFET;
a fifth switchable current source connected between the second power supply rail and the common node;
a first resistor connected between the body terminal of the first MOSFET and the common node;
a second resistor connected between the gate terminal of the first MOSFET and the common node; and
a BPS switching controller configured to control operation of the BPS circuit between a BPS ON state in which the first and second terminals are connected through the first and second MOSFETs and a BPS OFF state in which the first and second terminals are disconnected.

2. The BPS circuit of claim 1, further comprising:
a sixth switchable current source connected between the first power supply rail and a body terminal of the second MOSFET;
a seventh switchable current source connected between the second power supply rail and the body terminal of the second MOSFET; and
a third resistor connected between the body terminal of the second MOSFET and the common node,
wherein the gate terminals of the first and second MOSFETs are connected to each other.

3. The BPS circuit of claim 2, wherein the first and second MOSFETs are P-channel MOSFETs and an anode of each of the first and second source to body diodes is connected to the common node.

4. The BPS circuit of claim 3, wherein the third switchable current source is connected between the first power supply rail and the gate terminals of the first and second MOSFETs.

5. The BPS circuit of claim 2, comprising a current switching controller configured to operate the first, second, third, fourth, and fifth switchable current sources.

6. The BPS circuit of claim 5, wherein the current switching controller is configured, in the BPS OFF state, to switch on the first, fifth and seventh switchable current sources to apply a reverse bias voltage across the first and second source to body diodes.

7. The BPS circuit of claim 5, wherein the current switching controller is configured, in the BPS OFF state, to switch on the third and fifth switchable current sources to apply a positive gate to source voltage across the first and second MOSFETs.

8. The BPS circuit of claim 5, wherein the current switching controller is configured, in the BPS ON state, to switch on the second, fourth and seventh switchable current sources to apply a forward bias voltage across the first and second source to body diodes.

9. The BPS circuit of claim 2, wherein the first and second MOSFETs are N-channel MOSFETs and a cathode of each of the first and second source to body diodes is connected to the common node.

10. The BPS circuit of claim 9, wherein the third switchable current source is connected between the second power supply rail and the gate terminals of each of the first and second MOSFETs.

11. The BPS circuit of claim 9, comprising a current switching controller configured, in the BPS OFF state, to switch on the second, fourth and seventh switchable current sources to apply a reverse bias voltage across the first and second source to body diodes.

12. The BPS circuit of claim 11, wherein the current switching controller is configured, in the BPS OFF state, to switch on the second and third switchable current sources to apply a positive source to gate voltage across the first and second MOSFETs.

13. The BPS circuit of claim 11, wherein the current switching controller is configured, in the BPS ON state, to switch on the first, fifth and sixth switchable current sources to apply a forward bias voltage across the first and second source to body diodes.

14. A method of operating a bidirectional power switch (BPS) circuit, the BPS circuit comprising:
first and second terminals;
first and second MOSFETs connected in series between the first and second terminals and comprising respective first and second source to body diodes;
first and second power supply rails;
switchable current sources comprising:
a first switchable current source connected between the first power supply rail and a body terminal of the first MOSFET;
a second switchable current source connected between the first power supply rail and a common node connected to a source terminal of each of the first and second MOSFETS;
a third switchable current source connected between one of the first and second power supply rails and a gate terminal of the first MOSFET;
a fourth switchable current source connected between the second power supply rail and the body terminal of the first MOSFET; and
a fifth switchable current source connected between the second power supply rail and the common node;
a first resistor connected between the body terminal of the first MOSFET and the common node;
a second resistor connected between the gate terminal of the first MOSFET and the common node; and
a BPS switching controller configured to control operation of the BPS circuit between a BPS ON state in which the first and second terminals are connected through the first and second MOSFETs and a BPS OFF state in which the first and second terminals are disconnected,
the method comprising:
in a BPS ON state, operating the switchable current sources to apply a forward bias voltage across the first and second source to body diodes; and
in a BPS OFF state, operating the switchable current sources to apply a reverse bias voltage across the first and second source to body diodes.

15. The method of claim 14, wherein the first and second MOSFETs are P-channel MOSFETs and, in the BPS OFF state, the switchable current sources are operated to apply a positive gate to source voltage across the first and second MOSFETs.

16. The method of claim 15, wherein, in the BPS OFF state, a current switching controller switches on at least the first and fifth switchable current sources to apply a reverse bias voltage across the first and second source to body diodes.

17. The method of claim 16, wherein, in the BPS OFF state, the current switching controller switches on the third and fifth switchable current sources to apply a positive gate to source voltage across the first and second MOSFETs.

18. The method of claim 16, wherein, in the BPS ON state, the current switching controller switches on at least the second and fourth switchable current sources to apply a forward bias voltage across the first and second source to body diodes.

19. The method of claim 14, wherein the first and second MOSFETs are N-channel MOSFETs and, in the BPS OFF state, the switchable current sources are operated to apply a positive source to gate voltage across the first and second MOSFETs.

20. The method of claim 19, wherein, in the BPS OFF state, a current switching controller switches on at least the second and fourth switchable current sources to apply a reverse bias voltage across the first and second source to body diodes.

* * * * *